United States Patent
Sakamoto et al.

(10) Patent No.: US 7,960,712 B2
(45) Date of Patent: Jun. 14, 2011

(54) SWITCHING ELEMENT, SWITCHING ELEMENT DRIVE METHOD AND FABRICATION METHOD, RECONFIGURABLE LOGIC INTEGRATED CIRCUIT, AND MEMORY ELEMENT

(75) Inventors: Toshitsugu Sakamoto, Tokyo (JP); Hisao Kawaura, Tokyo (JP)

(73) Assignee: NEC Corporation, Tokyo (JP)

( * ) Notice: Subject to any disclaimer, the term of this patent is extended or adjusted under 35 U.S.C. 154(b) by 606 days.

(21) Appl. No.: 11/722,982

(22) PCT Filed: Dec. 22, 2005

(86) PCT No.: PCT/JP2005/023628
§ 371 (c)(1), (2), (4) Date: Jun. 27, 2007

(87) PCT Pub. No.: WO2006/070693
PCT Pub. Date: Jul. 6, 2006

(65) Prior Publication Data
US 2008/0036508 A1 Feb. 14, 2008

(30) Foreign Application Priority Data
Dec. 27, 2004 (JP) .................. 2004-377607

(51) Int. Cl.
*H01L 47/00* (2006.01)
(52) U.S. Cl. .................. 257/4; 257/2; 356/153
(58) Field of Classification Search .................. 257/2, 4
See application file for complete search history.

(56) References Cited

U.S. PATENT DOCUMENTS

| | | | | |
|---|---|---|---|---|
| 5,761,115 A | * | 6/1998 | Kozicki et al. | 365/182 |
| 7,116,573 B2 | * | 10/2006 | Sakamoto et al. | 365/153 |
| 2002/0168820 A1 | * | 11/2002 | Kozicki et al. | 438/259 |
| 2003/0138981 A1 | * | 7/2003 | Yamaguchi et al. | 438/22 |

FOREIGN PATENT DOCUMENTS

| JP | 2000-512058 A | 9/2000 |
|---|---|---|
| JP | 2002-536840 A | 10/2002 |
| JP | 2003-92387 A | 3/2003 |

* cited by examiner

*Primary Examiner* — Thao X Le
*Assistant Examiner* — Geoffrey Ida
(74) *Attorney, Agent, or Firm* — Sughrue Mion, PLLC

(57) ABSTRACT

The switching element of the present invention includes: an ion conduction layer (4) in which metal ions can move freely; a first electrode (1) that contacts the ion conduction layer (4); and a second electrode (2) that contacts the ion conduction layer (4), that is formed such that the ion conduction layer (4) is interposed between the first electrode (1) and the second electrode (2), and that supplies metal ions to the ion conduction layer (4) or that receives metal ions from the ion conduction layer (4) to cause precipitation of the metal that corresponds to the metal ions. An introduction path (5) composed of the metal and of a prescribed width is further provided on the ion conduction layer (4) for electrically connecting the first electrode (1) and the second electrode (2). The application of voltage to the first electrode (1) relative to the second electrode (2) then causes an electrochemical reaction between the introduction path (5) and the second electrode (2) whereby the electrical characteristics are switched.

8 Claims, 13 Drawing Sheets precipitated metal

US 7,960,712 B2

SWITCHING ELEMENT, SWITCHING ELEMENT DRIVE METHOD AND FABRICATION METHOD, RECONFIGURABLE LOGIC INTEGRATED CIRCUIT, AND MEMORY ELEMENT

TECHNICAL FIELD

The present invention relates to a switching element used in, for example, an integrated circuit, a drive method of the switching element, a fabrication method of the switching element, a reconfigurable logic integrated circuit that uses the switching element, and a memory element that uses the switching element.

BACKGROUND ART

A great quantity of integrated circuits are currently being used in electronic apparatuses. Many of the integrated circuits used in electronic apparatuses are Application-Specific Integrated Circuits (ASIC), and are dedicated circuits designed for specific electronic apparatuses. Among these application-specific integrated circuits, the arrangement of cells (logic circuits such as AND circuits and OR circuits) and connections between cells are carried out in the process of fabricating the integrated circuits and the circuit configuration therefore cannot be altered after fabrication.

In recent years, competition in the development of electronic apparatuses has become fierce, and further, progress is being made in the miniaturization of electronic apparatuses. Under these circumstances, attention has focused on programmable logic in which the circuit configuration can be altered by electronic signals even after fabrication to allow many functions to be offered by means of a single chip. Programmable logic is of a configuration in which a plurality of logic cells are connected together by way of a switching elements. Logic cells are logic circuits that serve as the units by which programmable logic is assembled. Representative examples of programmable logic include FPGA (Field-Programmable Gate Arrays) and DRP (Dynamically Reconfigurable Processors).

Although programmable logic has been attracting attention, the incorporation of programmable logic in electronic apparatuses is still limited. There are several reasons for this limitation. First, in programmable logic to date, the switching elements that provide mutual connections between logic cells are large and have high ON resistance. In response to this problem, programmable logic to date has been of configurations that employ few logic cells having a large number of transistors and that minimize these switching elements, which are large and have high ON resistance. These constraints limit the degree of freedom of the combination of logic cells and limit the functions of the programmable logic that can be offered. In other words, the large size and high ON resistance of switching elements have limited the functions of the programmable logic and have limited the range of application of incorporation of programmable logic in electronic apparatuses.

Diversifying the functions of programmable logic and promoting the incorporation of programmable logic in electronic apparatuses calls for both reducing the size of the switching elements that interconnect logic cells and reducing the ON resistance of these elements. As a device that can meet these conditions, a switching element (hereinbelow referred to as a "metal atom-mobile switching element") that uses metal ion movement in an ion conductor (a material in which ions can move freely) and an electrochemical reaction is proposed in JP-A-2002-536840. A metal atom-mobile switching element is known to be smaller and have lower ON resistance than semiconductor switching elements (such as MOSFETs) that have until now been widely used in programmable logic.

FIG. 1 is a schematic view for explaining a metal atom-mobile switching element of the related art. The metal atom-mobile switching element shown in FIG. 1 is a metal atom-mobile switching element made up from an ion conduction layer composed of an ion conductor ($Cu_2S$), a first electrode (Ti) that contacts the ion conduction layer, and a second electrode composed of metal (Cu) that contacts the ion conduction layer and that serves as a supply source of metal ions ($Cu^+$). The materials that make up each part are offered as examples.

When negative voltage is applied to first electrode (Ti) with second electrode (Cu) as a basis of the voltage, metal ions ($Cu^+$) ion conduction layer in the vicinity of the contact surface with the first electrode (Ti) are reduced and metal (Cu) precipitates at the surface ion conduction layer that contacts the first electrode (Ti). In response to the precipitation of metal (Cu), the metal (Cu) of the second electrode oxidizes, dissolves in the ion conduction layer in the form of metal ions ($Cu^+$), and maintains the balance of negative and positive ions within the ion conduction layer. The precipitated metal (Cu) grows in the direction of the second electrode (Cu) within the ion conduction layer. When the precipitated metal (Cu) contacts the second electrode (Cu), the switching element achieves the conductive (ON) state (refer to the left side of FIG. 1).

On the other hand, the application of a positive voltage to the first electrode (Ti) with the second electrode (Cu) as a basis of the voltage, produces the absolute opposite electrochemical reaction. As a result, metal (Cu) that extends from the first electrode (Ti) to the second electrode (Cu) is cut, and the switching element enters the nonconductive (OFF) state (see the right side of FIG. 1).

As described in the foregoing explanation, the metal atoms that make up the second electrode move between the first electrode and the second electrode in the form of a precipitate due to an electrochemical reaction, and in the conductive (ON) state form a metal interconnect that electrically connects the first electrode and the second electrode.

DISCLOSURE OF THE INVENTION

In the metal atom-mobile switching element described with reference to FIG. 1, the path of the metal interconnect composed of precipitate that forms in the ion conduction layer cannot be controlled. As a result, the problem arises that variation occurs in the switching element ON resistance, which depends on the path of the metal interconnect, among switching elements existing on the same wafer. This problem is believed to originate from differences in the locations where precipitate is prone to form in the surface of ion conduction layer that contacts the first electrode among switching elements that exist on the same wafer. This type of variation in ON resistance greatly lowers the reliability of metal atom-mobile switching elements.

A further problem that arises in a two-terminal metal atom-mobile switching element such as described with reference to FIG. 1 is the low resistance to electromigration. Electromigration is the phenomenon by which metal atoms that make up the metal interconnect are moved by collisions with electrons that flow through the metal interconnect. When a current of a particular fixed current density is caused to continuously flow through the metal interconnect in a high-temperature environment, the movement of metal atoms due to electromigration causes serious problems such as the disconnection of the metal interconnect.

As described hereinabove, in a metal atom-mobile switching element, metal atoms that have moved from the second electrode to between the first electrode and second electrode in the form of a precipitate due to an electrochemical reaction form a metal interconnect that electrically connects the first electrode and second electrode in the conductive (ON) state. To prevent electromigration in this metal interconnect, the amount of precipitate must be increased to thicken the metal interconnect and lower the density of the current that flows through the metal interconnect.

However, increasing the amount of precipitate to thicken the metal interconnect is problematic in a two-terminal metal atom-mobile switching element such as described with reference to FIG. 1. As the reason for this difficulty, increasing the amount of precipitate requires an increase in the absolute value of the negative voltage applied to the first electrode with the second electrode as a basis of the voltage, but once the metal interconnect that electrically connects the first electrode and second electrode has been formed, voltage that is applied between the first electrode and the second electrode only contributes to the flow of a large current to this metal interconnect and does not contribute to increasing the amount of precipitate for thickening the metal interconnect. Even though the voltage has been increased to prevent electromigration, the large volume of current that flows to the metal interconnect has the potential for inducing electromigration instead.

It is an object of the present invention to provide a metal atom-mobile switching element that suppresses variation in the ON resistance between switching elements on the same wafer and that increases the resistance against electromigration, a method of driving the metal atom-mobile switching element, a method of fabricating the metal atom-mobile switching element, a reconfigurable logic integrated circuit that uses the metal atom-mobile switching element, and a memory element that uses the metal atom-mobile switching element.

The present invention was achieved with the purpose of solving the problems inherent to the above-described related art and has as its object the provision of a switching element that suppresses variation in ON resistance among switching elements on the same wafer and increasing resistance against electromigration, a method of driving the switching element, a method of fabricating the switching element, a reconfigurable logic integrated circuit, and a memory element.

To achieve the above-described objects, one switching element of the present invention includes: an ion conduction part that contains an ion conductor in which metal ions can move freely; a first electrode that contacts the ion conduction part; and a second electrode that contacts the ion conduction part, that is formed such that the ion conduction part is interposed between the second electrode and the first electrode, and that supplies metal ions to the ion conductor or that accepts metal ions from the ion conductor to cause precipitation of metal that corresponds to the metal ions. In addition, an introduction path of a prescribed width and composed of the above-described metal for electrically connecting the first electrode and second electrode is formed at a prescribed position in advance in the ion conduction part. Then, the application of voltage to the first electrode relative to the second electrode causes an electrochemical reaction between the introduction path and the second electrode, whereby the electrical properties of the switching element switch.

In the present invention, the route of the metal interconnect depends on the route of the introduction path, and variation in the ON resistance between switching elements on the same wafer can be suppressed if the routes of the introduction paths are unified in each switching element on the wafer in advance. In addition, the width of the metal interconnect depends on the width of the introduction path, and the resistance to electromigration can therefore be increased if the width of the introduction path that is formed in advance is made sufficiently thick.

EXPLANATION OF REFERENCE NUMBERS

| | |
|---|---|
| 0 | substrate |
| 1 | first electrode |
| 2 | second electrode |
| 3 | third electrode |
| 4 | ion conduction layer |
| 5 | introduction path |

BEST MODE FOR CARRYING OUT THE INVENTION

Explanation next regards embodiments of the present invention with reference to the accompanying figures.

First Embodiment

The metal atom-mobile switching element of the present embodiment is a device in which, compared to a conventional two-terminal metal atom-mobile switching element, the position of an introduction path for electrically connecting a first electrode and a second electrode is determined in advance in the design stage and in which the introduction path is formed in this position using the metal that makes up the second electrode in the fabrication stage. By thus providing the introduction path in a prescribed position in advance in the design stage and fabrication stage, the route of a metal interconnect that depends on the route of the introduction path is determined in the design stage and fabrication stage. By making this prescribed position common to all switching elements on the same wafer, the routes of the metal interconnects are common for all switching elements, whereby variation in the ON resistance among switching elements on the same wafer can be reduced. In addition, the introduction path formed in advance in the design stage and fabrication stage is made sufficiently thick. The width of the metal interconnect depends on the width of the introduction path, and the resistance against electromigration can therefore be increased.

Figure 1:
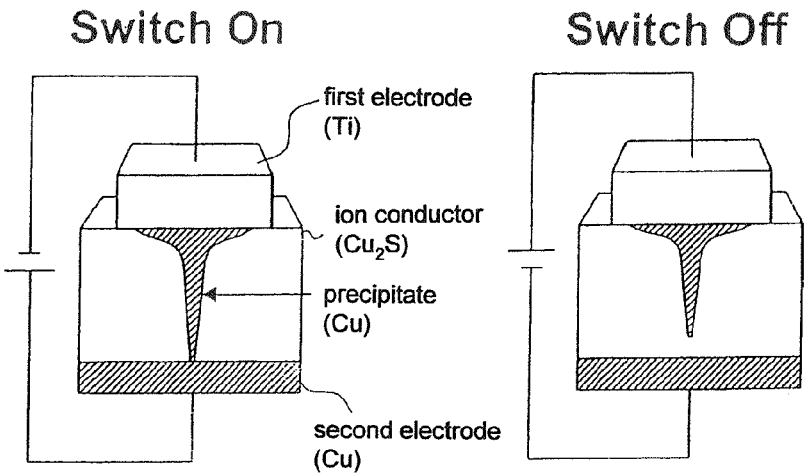
FIG. 1 is a schematic view for explaining the configuration of a metal atom-mobile switching element of the related art.
Figure 2:
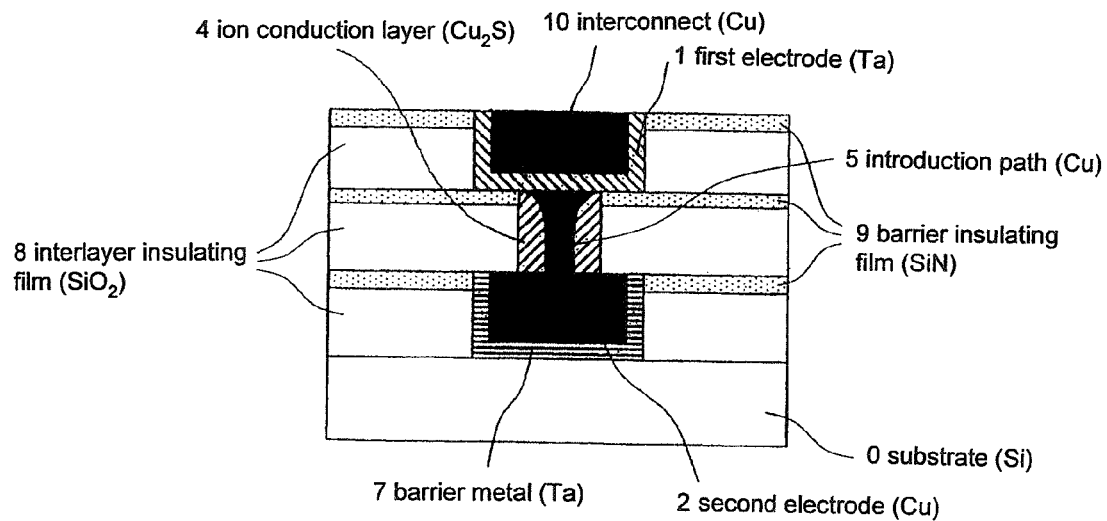
FIG. 2 is a schematic sectional view showing an example of the configuration of a metal atom-mobile switching element of a first exemplary embodiment.

FIG. 2 is a schematic sectional view showing an example of the configuration of the metal atom-mobile switching element of the present embodiment.

The metal atom-mobile switching element of the present embodiment includes first electrode 1 (Ta), second electrode 2 (Cu), ion conduction layer 4 ($Cu_2S$), and introduction path 5 (Cu). Examples of the materials that make up each component are shown in parentheses. As shown in FIG. 2, an integrated circuit is formed, and second electrode 2 is formed on a substrate 0 that is a silicon substrate in which the surface is covered by $SiO_2$. The side surface and bottom surface of second electrode 2 are covered by barrier metal 7 (Ta). Ion conduction layer 4 and introduction path 5 are formed over second electrode 2. Ion conduction layer 4 is formed to enclose the side surfaces of introduction path 5. First electrode 1 is provided over ion conduction layer 4 and introduction path 5.

First electrode 1 and second electrode 2 contact ion conduction part 4. Introduction path 5 is determined in a prescribed position in advance in the design stage to electrically connect first electrode 1 and second electrode 2 and is formed in this position in the fabrication stage. Introduction path 5 is composed of the same metal as the metal that makes up second electrode 2. Introduction path 5 is both made up by the same route for all switching elements on the same wafer and is formed at a prescribed width that can be expected to provide resistance to electromigration.

Barrier metal 7 prevents the diffusion of metal ions ($Cu^+$) from second electrode 2. First electrode 1, second electrode 2, and ion conduction layer 4 are each embedded in interlayer insulating film 8 ($SiO_2$). Introduction path 5 is embedded in the same interlayer insulating film 8 as ion conduction layer 4. Interlayer insulating film 8 has the function of lowering the electrostatic capacity of the switching element. Barrier insulating layer 9 (SiN) formed on interlayer insulating film 8 is a stopper when carrying out chemical mechanical polishing (CMP) in the fabrication method to be described hereinbelow. Interconnect 10 (Cu) in which the side surfaces and bottom surface are covered by first electrode 1 serves as the interconnect for electrically connecting the switching element with the integrated circuit. Ta that is used in first electrode 1 has the function of preventing the diffusion of metal ions ($Cu^+$) from this interconnect 10.

Explanation next regards the operation of the metal atom-mobile switching element of the first embodiment of the present invention. When the initial state of the switching element is ON, positive voltage is applied to first electrode 1 relative to second electrode 2 to set the switching element to the OFF state, whereby the metal (Cu) of introduction path 5 becomes metal ions ($Cu^+$) which move through ion conduction layer 4 to precipitate as metal (Cu) at second electrode 2. As a result, a portion of introduction path 5 is cut and the switching element transitions to the OFF state. Applying negative voltage to first electrode 1 relative to second electrode 2 produces the opposite electrochemical reaction, whereby the switching element changes from this state to the ON state.

On the other hand, when the initial state of the switching element is the OFF state, applying a negative voltage to first electrode 1 relative to second electrode 2 sets the switching element in the ON state, following which the application of positive voltage to first electrode 1 relative to second electrode 2 changes the switching element from this state to the OFF state. From the stage before the electrical connection is completely cut, changes in the electrical characteristics occur such as increase in the resistance between first electrode 1 and second electrode 2 and changes in the capacitance between electrodes, following which the electrical connection is finally cut.

In a metal atom-mobile switching element of the related art, the metal that precipitates due to the application of voltage between two electrodes produced the electrical connection between the two electrodes. In contrast, in the metal atom-mobile switching element of the present embodiment, introduction path 5 in which the width and the route are controlled is provided as a metal interconnect between first electrode 1 and second electrode 2 to electrically connect these two electrodes in advance. Then, in the switching operation, the voltage applied between the two electrodes is controlled as described hereinabove to cut and reconnect the metal interconnect realized by introduction path 5 between the two electrodes. The metal interconnect that connects the two electrodes is formed at the width prescribed in advance, whereby no great changes occur in the route or width of the metal interconnect despite repeated switching between ON and OFF. The interconnect therefore has greater resistance against electromigration than the related art.

In addition, when the switch is in the ON state at the time of fabrication of the switching element and it is desired to set the switch in the OFF state in the stage preceding operation of the switch, a positive voltage may be applied to first electrode 1 relative to second electrode 2 after the fabrication of the switching element.

Explanation next regards the method of fabricating the metal atom-mobile switching element of the present embodiment.

FIGS. 3A to 3I are schematic sectional views for explaining the method of fabricating the metal atom-mobile switching element of the present embodiment.

Figure 3A:
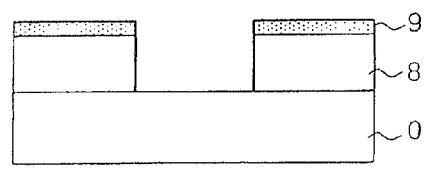
FIG. 3A is a schematic sectional view for explaining the method of fabricating the metal atom-mobile switching element of the first exemplary embodiment.

A process described hereinbelow is carried out in the step shown in FIG. 3A. A sputtering method is used to deposit on substrate 0: $SiO_2$ having a film thickness of 0.5 μm to serve as interlayer insulating film 8, and SiN having a film thickness of 0.05 μm to serve as barrier insulating film. Interlayer insulating film 8 may contain, for example, fluorine or carbon to achieve a greater reduction of the dielectric constant. Barrier insulating film 9 may be SiC, which has higher CMP resistance. After the deposition of these films, a resist pattern is formed by lithography and an opening is provided by means of etching in interlayer insulating film 8 and barrier insulating film 9, following which the resist pattern is removed.

Figure 3B:
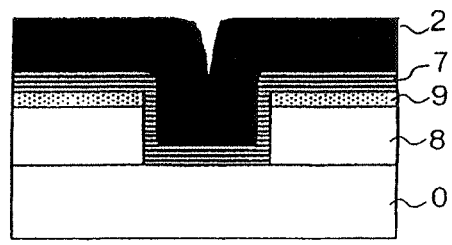
FIG. 3B is a schematic sectional view for explaining the method of fabricating the metal atom-mobile switching element of the first exemplary embodiment.

In the step shown in FIG. 3B, a sputtering method is used to form Ta that will serve as barrier metal 7 and that has a film thickness of 0.05 μm, and a plating method is used to form Cu that will serve as second electrode 2 to a film thickness of 1 μm. Barrier metal 7 may be of a laminated structure of Ta and TaN.

Figure 3C:
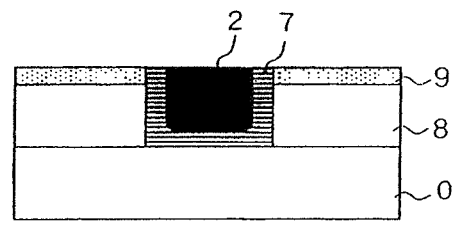
FIG. 3C is a schematic sectional view for explaining the method of fabricating the metal atom-mobile switching element of the first exemplary embodiment.

In the step shown in FIG. 3C, a CMP method is used to remove material other than barrier metal 7 and second electrode 2 in the opening. At this time, barrier insulating film 9 serves as the stopper of the CMP process.

Figure 3D:
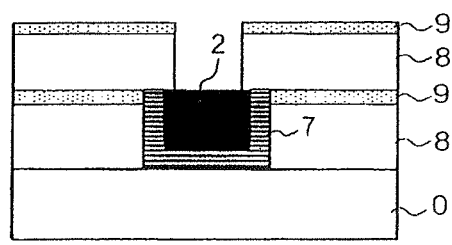
FIG. 3D is a schematic sectional view for explaining the method of fabricating the metal atom-mobile switching element of the first exemplary embodiment.

In the step shown in FIG. 3D, the following process is carried out. Using a sputtering method, $SiO_2$ that will serve as interlayer insulating film 8 is deposited to a thickness of 0.5 μm and SiN that will serve as barrier insulating film 9 is deposited to a thickness of 0.05 μm. Following deposition of these films, a resist pattern is formed by lithography, and an opening is provided in interlayer insulating film 8 and barrier insulating film 9 by means of etching. The resist pattern is then removed.

Figure 3E:
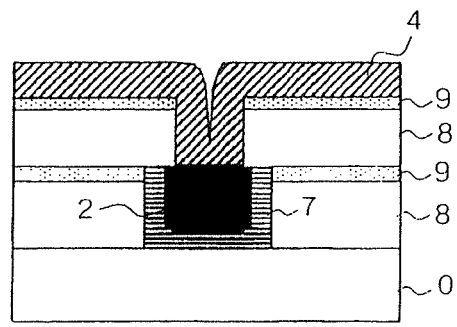
FIG. 3E is a schematic sectional view for explaining the method of fabricating the metal atom-mobile switching element of the first exemplary embodiment.

In the step shown in FIG. 3E, a sputtering method is used to form $Cu_2S$ that will serve as ion conduction layer 4 to a thickness of 0.3 μm.

Figure 3F:
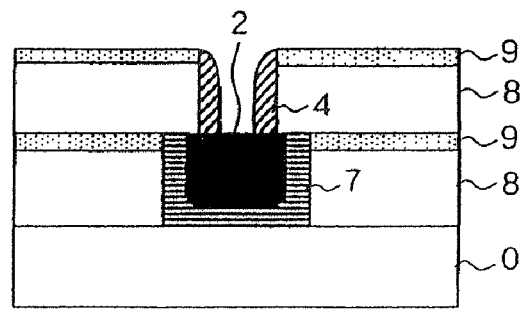
FIG. 3F is a schematic sectional view for explaining the method of fabricating the metal atom-mobile switching element of the first exemplary embodiment.

In the step shown in FIG. 3F, ion conduction layer 4 on barrier insulating film 9 is removed by anisotropic etching. At this time, ion conduction layer 4 on the side walls of the opening remain without being etched and become sidewalls. The sidewalls are cylindrical with a rounded upper end and contact the inner walls of the opening at their outer sides. The size of the opening formed by the sidewalls (which sets the width of introduction path 5) can be accurately controlled by controlling the film thickness of ion conduction layer 4 and the etching time. As a result, an opening of a small size that exceeds the limits of lithography can be formed.

Figure 3G:
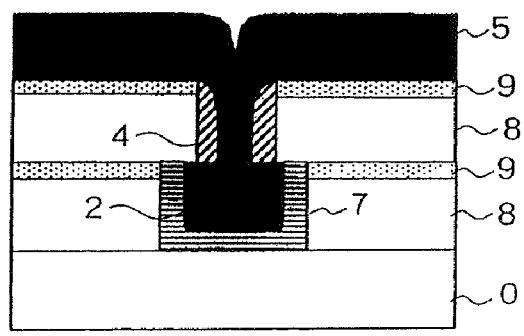
FIG. 3G is a schematic sectional view for explaining the method of fabricating the metal atom-mobile switching element of the first exemplary embodiment.

In the step shown in FIG. 3G, a sputtering method and plating method are used to form Cu for introduction path 5 to a film thickness of 1 μm.

Figure 3H:
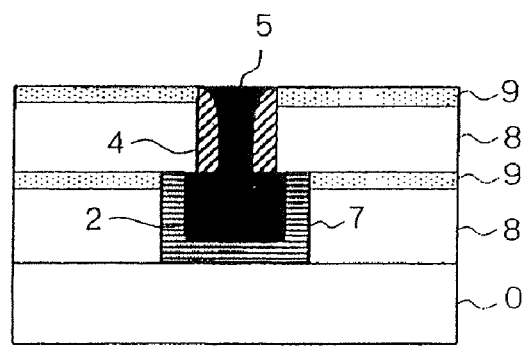
FIG. 3H is a schematic sectional view for explaining the method of fabricating the metal atom-mobile switching element of the first exemplary embodiment.

In the step shown in FIG. 3H, a CMP method is used to shave away Cu in portions other than the Cu inside the opening that serves as introduction path 5. At this time, barrier insulating film 9 serves as the stopper of CMP.

Figure 3I:
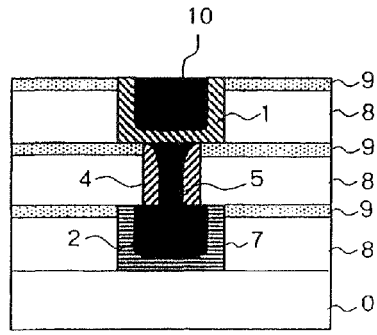
FIG. 3I is a schematic sectional view for explaining the method of fabricating the metal atom-mobile switching element of the first exemplary embodiment.

In the step shown in FIG. 3I, the following process is carried out. Using a sputtering method, $SiO_2$ that will serve as interlayer insulating film 8 is deposited to a film thickness of 0.5 μm, following which SiN that will serve as barrier insulating film 9 is formed to a film thickness of 0.05 μm. After deposition of these films, a resist pattern is formed by lithography, following which an opening is provided by means of etching in interlayer insulating film 8 and barrier insulating film 9. The resist pattern is then removed. Next, a sputtering method and a plating method are used to form Ta that will serve as first electrode 1 to a film thickness of 0.05 μm and Cu that will serve as interconnect 10 to a film thickness of 1 μm. A CMP method is next used, whereby first electrode 1 and interconnect 10 are left inside the opening and other portions are cleared away. At this time, barrier insulating film 9 serves as the stopper of CMP.

In the present embodiment, a case was presented in which introduction path 5 was formed to electrically connect first electrode 1 and second electrode 2, but the present invention is not limited to this form. If the route and width of the metal interconnect that is produced by the switching operation grows to a degree that depends on the route and width of introduction path 5, introduction path 5 need not completely connect first electrode 1 and second electrode 2 in advance. In this case as well, the effects of preventing variations in the ON resistance and providing resistance against electromigration can be obtained as in a case in which first electrode 1 and second electrode 2 are completely connected. In this case, however, the state of the switch is OFF at the time of fabricating the switching element.

The combination of introduction path 5 and ion conduction layer 4 is not limited to a metal (Cu) and an ion conductor ($Cu_2S$). Instead of the combination of a metal and an ion conductor, a combination of a high ion conductor, which is an ion conductor in which the mobility of ions inside the conductor is high, and a low ion conductor, which is an ion conductor in which the mobility of ions inside the conductor is low, may be used. More specifically, the combination of $Cu_2S$, which is a high ion conductor, and $Ta_2O_5$ or $SiO_2$, which are low ion conductors, may be considered.

Because a high ion conductor tends to selectively conduct metal ions ($Cu^+$), precipitate tends to selectively grow along the route of the high ion conductor. Forming the route of the high ion conductor in advance is equivalent to determining the route of the metal interconnect that depends on the route of the high ion conductor in the design stage and fabrication stage and enables a reduction of the variation in ON resistance among switching elements on the same wafer.

In addition, the width of the metal interconnect depends on the width of the route of the high ion conductor. Making the route of the high ion conductor that is formed in advance sufficiently thick enables an increase of the resistance against electromigration. In this case, however, the route of the high ion conductor does not electrically connect first electrode 1 and second electrode 2, and the state of the switching element at the time of fabrication is therefore OFF.

Second Embodiment

In the metal atom-mobile switching element of the present embodiment, the introduction path for electrically connecting the first electrode and second electrode is formed at a prescribed position in advance by a method that differs from the first embodiment. By thus forming the introduction path at a prescribed position in advance in the design stage and fabrication stage, the route of the metal interconnect that depends on the route of the introduction path is determined in the design stage and fabrication stage, enabling a reduction of the variation in the ON resistance among switching elements on the same wafer. In addition, the introduction path formed in advance in the design stage and fabrication stage is made sufficiently thick. Because the width of the metal interconnect depends on the width of the introduction path, the resistance against electromigration can be increased.

In addition, in the metal atom-mobile switching element of the present embodiment, a third electrode composed of the same metal that makes up the introduction path is provided for controlling the width of the metal interconnect to produce a three-terminal metal atom-mobile switching element. This approach can achieve a further increase in the resistance against electromigration.

When a third electrode is provided in this way, a further increase in the resistance against electromigration can be realized. The reasons for this increase are described hereinbelow. The metal interconnect does no more than connect the first electrode and the second electrode. Voltage that is applied to the third electrode increases the amount of precipitate without contributing appreciably to increasing the current that flows to the metal interconnect that electrically connects the first electrode and the second electrode and therefore contributes to increasing the width of the metal interconnect. By increasing the width of the metal interconnect, a further increase in the resistance to electromigration can be achieved.

Figure 4:
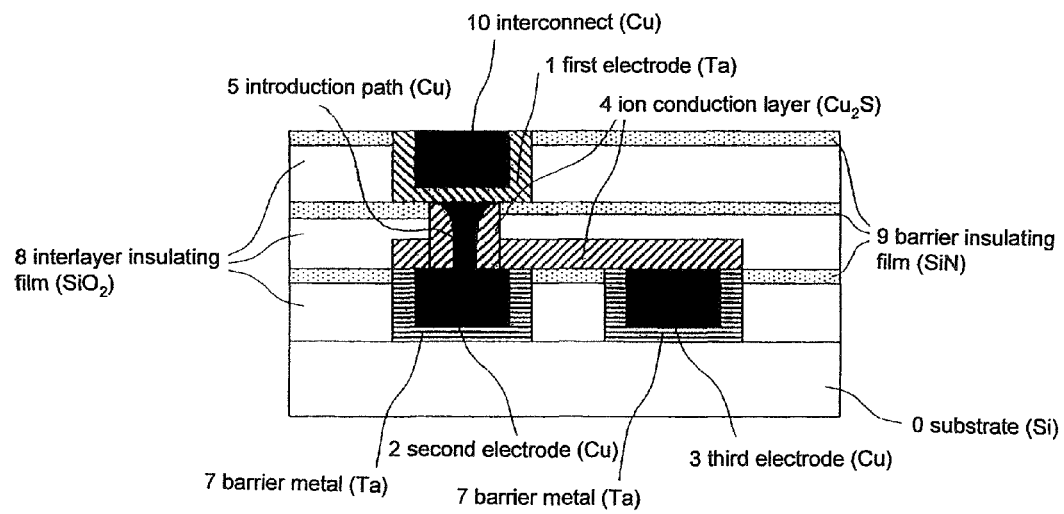
FIG. 4 is a schematic sectional view showing an example of the configuration of the metal atom-mobile switching element of the second exemplary embodiment.

FIG. 4 is a schematic sectional view showing an example of the configuration of the metal atom-mobile switching element of the present embodiment.

Second electrode 2 (Cu), third electrode 3 (Cu), ion conduction layer 4 ($Cu_2S$), and first electrode 1 (Ta) are formed on substrate 0. First electrode 1, second electrode 2, and third electrode 3 each contact ion conduction layer 4. Introduction path 5 (Cu) is formed in advance in the design stage and fabrication stage for electrically connecting first electrode 1 and second electrode 2. Introduction path 5 is composed of the same metal as the metal that makes up second electrode 2 and third electrode 3. Introduction path 5 is made up by the same route for the switching elements on the same wafer and is formed at a prescribed width that can be expected to provide electromigration resistance. Barrier metal 7 (Ta), interlayer insulating film 8 ($SiO_2$), barrier insulating film 9 (SiN), and interconnect 10 (Cu) each have the same functions as in the first embodiment.

In a metal atom-mobile switching element of the related art, metal that precipitates due to the application of voltage across the two electrodes electrically connects the two electrodes. In the metal atom-mobile switching element of the second embodiment, in contrast, first electrode 1 and second electrode 2 are electrically connected in advance by a metal interconnect composed of introduction path 5 for which the route and width are controlled. The switching operation is then brought about by applying voltage across two electrodes (first electrode 1 and second electrode 2, or first electrode 1 and third electrode 3), whereby the metal interconnect made up by introduction path 5 is either disconnected or reconnected. Accordingly, the metal interconnect that electrically connects first electrode 1 and second electrode 2 does not undergo changes in route or width despite repetitions of ON and OFF.

The switch state is therefore ON at the time of fabrication of the switching element, and if the OFF state is then desired, positive voltage is applied to first electrode 1 relative to second electrode 2 after the fabrication of the switching element. Alternatively, positive voltage is applied to first electrode 1 relative to third electrode 3.

Explanation next regards operation of the metal atom-mobile switching element of the second embodiment of the present invention. When the initial state of the switching element is the ON state, positive voltage is applied to first electrode 1 relative to second electrode 2 or third electrode 3 to set the switching element to the OFF state. By this operation, the metal (Cu) of introduction path 5 becomes metal ions ($Cu^+$) which move through ion conduction layer 4 to become a metal (Cu) and precipitate at second electrode 2 or third electrode 3. As a result, a portion of introduction path 5 is electrically cut and the switching element transitions to the OFF state. Next, application of negative voltage to first electrode 1 relative to second electrode 2 or third electrode 3 produces the opposite electrochemical reaction, whereby the switching element transitions from this state to the ON state.

On the other hand, when the initial state of the switching element is the OFF state, the application of negative voltage to first electrode 1 relative to second electrode 2 or third electrode 3 causes a transition to the ON state, and from this state, the application of positive voltage to first electrode 1 relative to second electrode 2 or third electrode 3 causes the transition to the OFF state.

When applying negative voltage to first electrode 1 relative to second electrode 2 to change from the OFF state to the ON state, the growth of metal stops from the time that first electrode 1 and second electrode 2 are connected, even when the metal of the connection site is thin. In such a case, negative voltage may be applied to first electrode 1 relative to the third electrode with first electrode 1 and second electrode 2 in an electrically connected state, whereby the metal interconnect is made thicker.

Introduction path 5, which is the originally formed interconnect, may in some cases deteriorate with repeated ON/OFF switching. In such cases, negative voltage may be applied to the first electrode relative to the third electrode with first electrode 1 and second electrode 2 in an electrically connected state, whereby the metal interconnect is restored.

Explanation next regards the method of fabricating the metal atom-mobile switching element of the present embodiment.

FIGS. 5A to 5G are schematic sectional views for explaining the method of fabricating the metal atom-mobile switching element of the present embodiment.

Figure 5A:
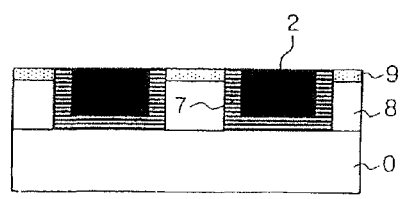
FIG. 5A is a schematic sectional view for explaining the method of fabricating the metal atom-mobile switching element of the second exemplary embodiment.

In the step shown in FIG. 5A, a sputtering method is used to deposit on substrate 0: $SiO_2$ to a film thickness of 0.5 μm to serve as interlayer insulating film 8, and SiN to a film thickness of 0.05 μm to serve as a barrier insulating layer. Interlayer insulating film 8 may contain, for example, fluorine or carbon to further lower the dielectric constant. Barrier insulating film 9 may also be SiC, which has higher CMP resistance. After deposition, a resist pattern is formed by lithography, and openings are then provided in interlayer insulating film 8 and barrier insulating film 9 by etching. A sputtering method and a plating method are then used to form Ta to a film thickness of 0.05 μm to serve as barrier metal 7, and Cu to a film thickness of 1 μm to serve as second electrode 2 and third electrode 3. Barrier metal 7 may be of a laminated construction of Ta and TaN. A CMP method is next used to remove material other than barrier metal 7, second electrode 2, and third electrode 3 inside the openings. At this time, barrier insulating film 9 serves as the CMP stopper.

Figure 5B:
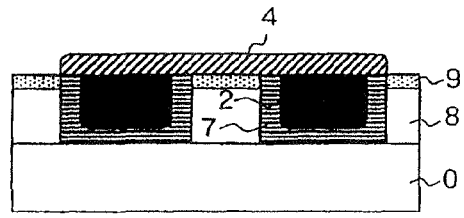
FIG. 5B is a schematic sectional view for explaining the method of fabricating the metal atom-mobile switching element of the second exemplary embodiment.

In the step shown in FIG. 5B, a sputtering method is used to deposit $Cu_2S$, which will serve as ion conduction layer 4. A resist pattern is next formed by lithography, following which a pattern is formed by etching that connects second electrode 2 and third electrode 3.

Figure 5C:
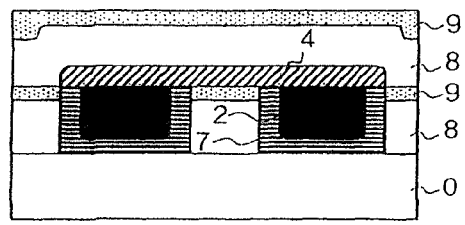
FIG. 5C is a schematic sectional view for explaining the method of fabricating the metal atom-mobile switching element of the second exemplary embodiment.

In the step shown in FIG. 5C, a sputtering method is used to deposit $SiO_2$ to a film thickness of 0.2 μm to serve as interlayer insulating film 8, and SiN to a film thickness of 0.5 μm to serve as barrier insulating film 8. A CMP method is next used to level the surface.

Figure 5D:
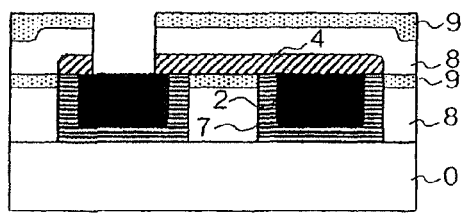
FIG. 5D is a schematic sectional view for explaining the method of fabricating the metal atom-mobile switching element of the second exemplary embodiment.

In the step shown in FIG. 5D, a resist pattern is formed by lithography, following which an opening is provided by etching in interlayer insulating film 8 and barrier insulating film 9.

Figure 5E:
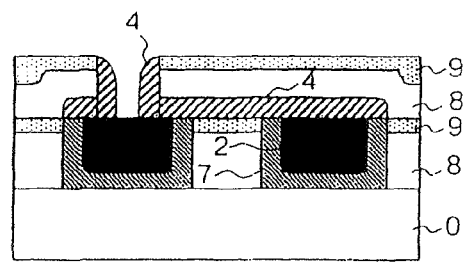
FIG. 5E is a schematic sectional view for explaining the method of fabricating the metal atom-mobile switching element of the second exemplary embodiment.

In the step shown in FIG. 5E, a sputtering method is used to form $Cu_2S$ to a film thickness of 0.3 μm to serve as ion conduction layer 4. Ion conduction layer 4 that is on barrier insulating film 9 is next removed by anisotropic etching. At this time, ion conduction layer 4 on the inner walls of the opening do not undergo etching and remain as sidewalls. The sidewalls are cylindrical, have a round upper end, and contact the inner walls of the opening along their outer sides. The size of the opening (which sets the width of introduction path 5) formed by the sidewalls can be accurately controlled by controlling the film thickness of ion conduction layer 4 and the etching time, whereby an opening can be formed in a size that exceeds the limits of lithography.

Figure 5F:
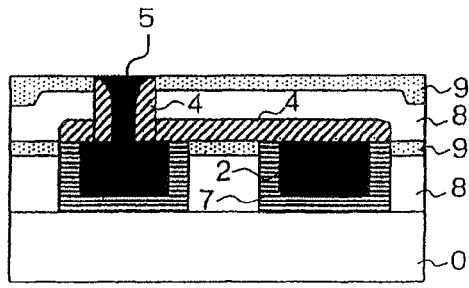
FIG. 5F is a schematic sectional view for explaining the method of fabricating the metal atom-mobile switching element of the second exemplary embodiment.

In the step shown in FIG. 5F, a sputtering method and a plating method are used to form Cu to a film thickness of 1 μm to serve as introduction path 5. A CMP method is next used to remove material other than introduction path 5 inside the opening. At this time, barrier insulating film 9 serves as the CMP stopper.

Figure 5G:
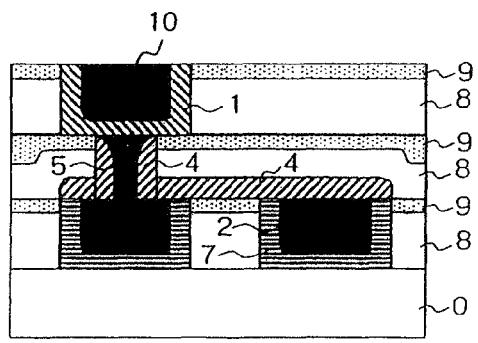
FIG. 5G is a schematic sectional view for explaining the method of fabricating the metal atom-mobile switching element of the second exemplary embodiment.

In the step shown in FIG. 5G, a sputtering method is used to deposit a silicon oxide film to a film thickness of 0.5 μm to serve as interlayer insulating film 8, and SiN to a film thickness of 0.05 μm to serve as barrier insulating film 9. After the deposition, a resist pattern is formed by lithography, following which an opening is provided by etching in interlayer insulating film 8 and barrier insulating film 9. A sputtering method and a plating method are next used to form Ta to a film thickness of 0.05 μm to serve as first electrode 1, and Cu to a film thickness of 1 μm to serve as interconnect 10. A CMP method is next used to remove material other than first electrode 1 and interconnect 10 inside the opening. At this time, barrier insulating film 9 is the CMP stopper.

In the present embodiment, introduction path 5 is formed to electrically connect first electrode 1 and second electrode 2, but if the route and width of the metal interconnect that is created are formed to an extent that depends on the route and width of introduction path 5, introduction path 5 need not completely connect first electrode 1 and second electrode 2. In this case as well, the same effects, i.e., the effects of preventing variation in ON resistance and realizing electromigration resistance, can be obtained as for a case of complete connection. In this case, however, the state of the switching element at the time of fabrication is the OFF state.

In addition, second electrode 2 need not be composed of the same metal (Cu) as introduction path 5, and switching may be carried out using only third electrode 3. This is because introduction path 5 is already formed between first electrode 1 and the second electrode and a metal interconnect composed of a precipitate is formed between first electrode 1 and third electrode 3 even if switching is carried out using only third electrode 3, whereby concerns regarding malfunctioning of the switching element are eliminated.

In addition, the combination of introduction path 5 and ion conduction layer 4 is not limited to a metal (Cu) and ion conductor ($Cu_2S$), but may be a combination of $Cu_2S$, which is a high ion conductor, and $Ta_2O_5$ or $SiO_2$, which are low ion conductors. Because a high ion conductor tends to selectively conduct metal ions ($Cu^+$), a precipitate tends to selectively grow along the route of the high ion conductor. Accordingly, by forming the route of the high ion conductor in advance, the route of the metal interconnect that depends on the route of the high ion conductor is determined in the design stage and fabrication stage, and variations in the ON resistance among switching elements on the same wafer can therefore be reduced.

In addition, the route of the high ion conductor that is formed in advance is made sufficiently thick. The width of the metal interconnect depends on the width of the route of the high ion conductor, and resistance against electromigration can therefore be increased. In this case, second electrode 2 must be composed of a metal (Cu) that can supply metal ions to the ion conductor. The reason for this requirement is that the metal interconnect has still not been formed between first electrode 1 and second electrode 2 in this case, and when switching is carried out using only third electrode 3, a metal interconnect composed of a precipitate is formed between first electrode 1 and third electrode 3, raising the concern of malfunctions of the switching element. In addition, the route of the high ion conductor does not electrically connect first electrode 1 and second electrode 2 in this case, and the state of the switching element at the time of fabrication is therefore OFF.

Third Embodiment

In the metal atom-mobile switching element of the second embodiment, introduction path 5 was formed in advance at a prescribed position between first electrode 1 and second electrode 2 in the design stage and fabrication stage, whereby the route of the metal interconnect was determined in the design stage and fabrication stage and variation in the ON resistance among switching elements on the same wafer was reduced. However, as an issue distinct from variation in the ON resistance, in a three-terminal metal atom-mobile switching element such as the metal atom-mobile switching element of the second embodiment, the metal interconnect composed of a precipitate is not formed between the first electrode and second electrode, but rather, is formed between the first electrode and third electrode, raising the concern of malfunctions of the switching element.

As a result, the route of the metal interconnect must be controlled in a three-terminal metal atom-mobile switching element not only for the purpose of preventing variation in ON resistance, but also to prevent malfunctions of the switching element due to the formation of a metal interconnect between the first electrode and the third electrode.

The metal atom-mobile switching element of the present embodiment is directed toward forming an introduction path in the design stage and fabrication stage to solve not only the problem of variation in the ON resistance, but also the problem that a metal interconnect is also formed between the first electrode and third electrode. If attention is focused on solving only the latter problem, a solution can be achieved by a simpler method.

As one simple method of solving this problem, the first to third electrodes and the ion conduction part are arranged such that the metal interconnect is preferentially formed between the first electrode and the second electrode. More specifically, this method involves optimizing the distances between the first to third electrodes and the ion conduction part. In this case, however, the possibility still remains that a metal interconnect will form between the first electrode and the third electrode when the ON/OFF states are repeatedly changed.

The metal atom-mobile switching element of the present embodiment provides a solution to the problem of the formation of a metal interconnect between the first electrode and third electrode that is simpler than the second embodiment and more effective than the above-described method. In addition, the inclusion of a third electrode allows an increase in the resistance to electromigration.

Figure 6:
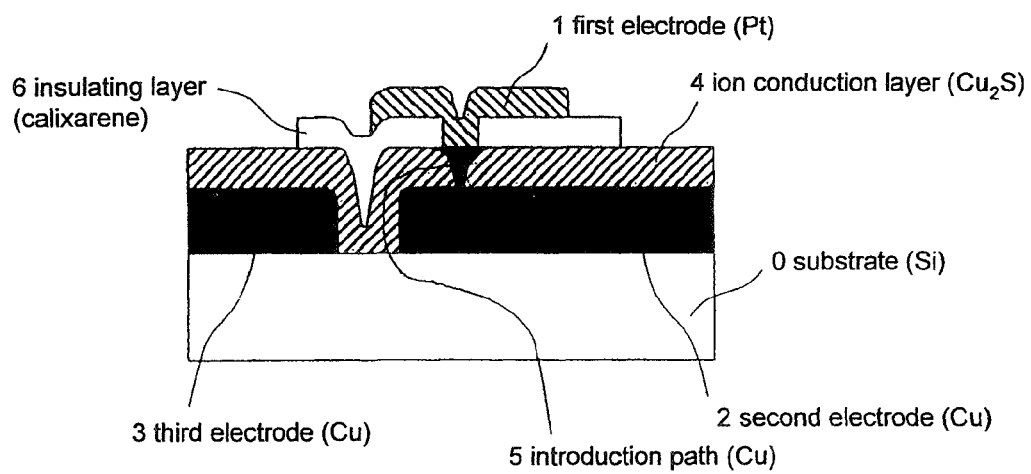
FIG. 6 is a schematic sectional view showing an example of the configuration of the metal atom-mobile switching element of the third exemplary embodiment.

FIG. 6 is a schematic sectional view showing an example of the configuration of the metal atom-mobile switching element of the present embodiment.

Second electrode 2 (Cu), third electrode 3 (Cu), ion conduction layer 4 ($Cu_2S$), and first electrode 1 (Pt) are formed on substrate 0. First electrode 1, second electrode 2, and third electrode 3 contact ion conduction layer 4. Introduction path 5 (Cu) is formed in advance to electrically connect first electrode 1 and second electrode 2, but in contrast to the first and second embodiments, introduction path 5 is formed electrically. Insulating layer 6 (calixarene) is an insulating layer for reducing the area in which first electrode 1 contacts ion conduction layer 4.

Explanation first regards the method of forming parts other than introduction path 5 (Cu). A silicon substrate covered by $SiO_2$ with a film thickness of 300 nm is used as substrate 0. Using a lithographic technique and lift-off technique of the related art, Cu is formed to a film thickness of 100 nm on the $SiO_2$ for use as second electrode 2 and third electrode 3. Using the same techniques, $Cu_2S$ with a film thickness of 40 nm is laminated for use as ion conduction layer 4. $Cu_2S$ is formed by a laser ablation method. Calixarene is applied over the $Cu_2S$ by spin coating to a film thickness of 120 nm, following which patterning is carried out by means of a lithographic technique (formation of insulating layer 6). Finally, Pt with a film thickness of 40 nm is formed using a conventional technique for use as first electrode 1. Pt is deposited by a vacuum evaporation method or a sputtering method.

Figure 7A:
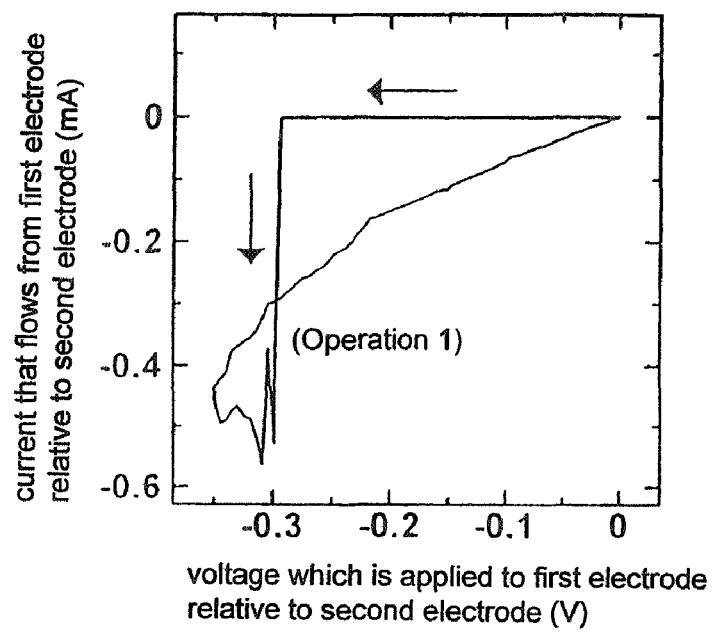
FIG. 7A is a graph showing the formation of the introduction path between first electrode 1 and second electrode 2 by applying a negative voltage to first electrode 1 relative to second electrode 2 in the metal atom-mobile switching element of the third exemplary embodiment of FIG. 6.
Figure 7B:
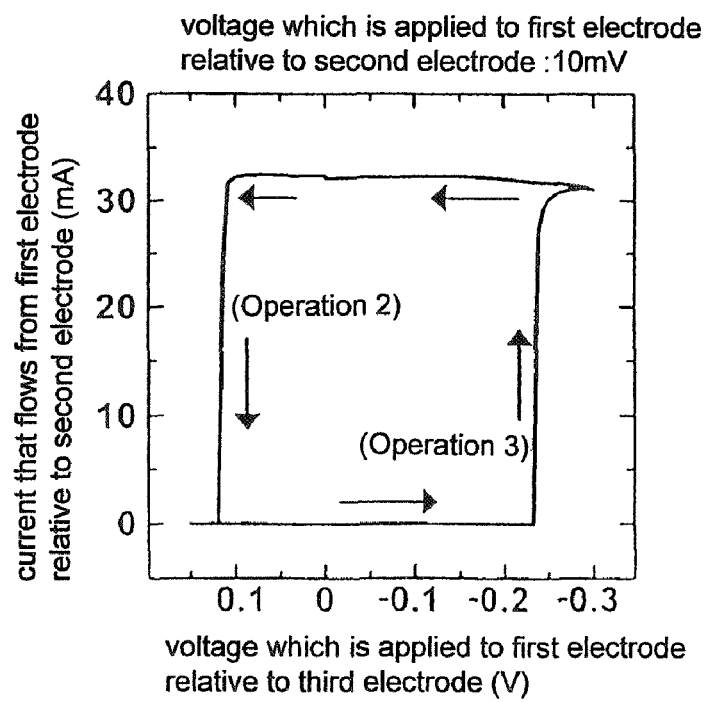
FIG. 7B is a graph showing the progression of the electrochemical reaction between third electrode 3 and the introduction path formed between first electrode 1 and second electrode 2 and the switching action realized by applying voltage to first electrode 1 relative to third electrode 3 in the metal atom-mobile switching element of the third exemplary embodiment of FIG. 6.

Explanation next regards the method of forming introduction path 5 (Cu). FIGS. 7A and 7B are graphs showing the operations for switching the metal atom-mobile switching element of the present embodiment.

A negative voltage of approximately −0.3 V is applied to first electrode 1 relative to second electrode 2. The application of voltage causes a Cu precipitate to grow between first electrode 1 and second electrode 2, whereby the two electrodes are electrically connected (this operation is referred to as "Operation 1"). FIG. 7A shows the results of observing the current that flows from first electrode 1 to second electrode 2 while changing the voltage applied to first electrode 1 relative to second electrode 2. It can be seen that the current increases rapidly in the negative direction at a voltage of −0.3 V. This large increase in current indicates that first electrode 1 and second electrode 2 are electrically connected. Introduction path 5 has been formed by the above-described process.

After the formation of introduction path 5, a negative voltage may be applied to first electrode 1 relative to third electrode 3, whereby the metal interconnect of introduction path 5 grows thicker. This process allows an increase in resistance against electromigration.

To bring about a switching operation, voltage is applied to first electrode relative to third electrode 3 (see FIG. 7B). To discern the state of the electrical connection between first electrode 1 and second electrode 2, an extremely small voltage (10 mV) is applied to first electrode 1 relative to second electrode 2. In the initial state, a connected state (ON) is established between first electrode 1 and second electrode 2.

When a positive voltage is applied to first electrode 1 relative to third electrode 3, a portion of the precipitate dissolves in ion conduction layer 4 by an electrochemical reaction and the state transitions to the OFF state (this operation is referred to as "Operation 2"). In the OFF state, the application of a negative voltage to first electrode 1 relative to third electrode 3 causes Cu to again precipitate, resulting in a transition to the ON state (this operation being called "Operation 3"). It is believed that the precipitate that dissolved in Operation 2 is again precipitated by Operation 3 and returns to the state of the precipitate that was formed by Operation 1. When Operation 3 is carried out without carrying out Operation 1, a case occurs in which first electrode 1 and second electrode 2 are electrically connected, and further, a case also occurs in which first electrode 1 and third electrode 3 are electrically connected. This indicates the possibility of forming a metal interconnect only between first electrode 1 and second electrode 2 by forming introduction path 5 by means of Operation 1.

Fourth Embodiment

In the metal atom-mobile switching elements of the first to third embodiments, an introduction path was formed in advance for electrically connecting first electrode 1 and second electrode 2. In the metal atom-mobile switching element of the present embodiment, rather than forming this type of introduction path in advance, a site for the formation of the precipitate that forms the metal interconnect that electrically connects the first electrode and second electrode is fixed by means of the structure of the switching element. In this way, the route of the metal interconnect is fixed and variation in ON resistance among switching elements on the same wafer can be reduced. In addition, the inclusion of a third electrode as in the metal atom-mobile switching element of the second or third embodiment enables an increase in the resistance against electromigration. Still further, the reliable formation of a metal interconnect between the first electrode and the second electrode can prevent malfunction of the switching element that arises from the formation of a metal interconnect between the first electrode and the third electrode.

Figure 8:
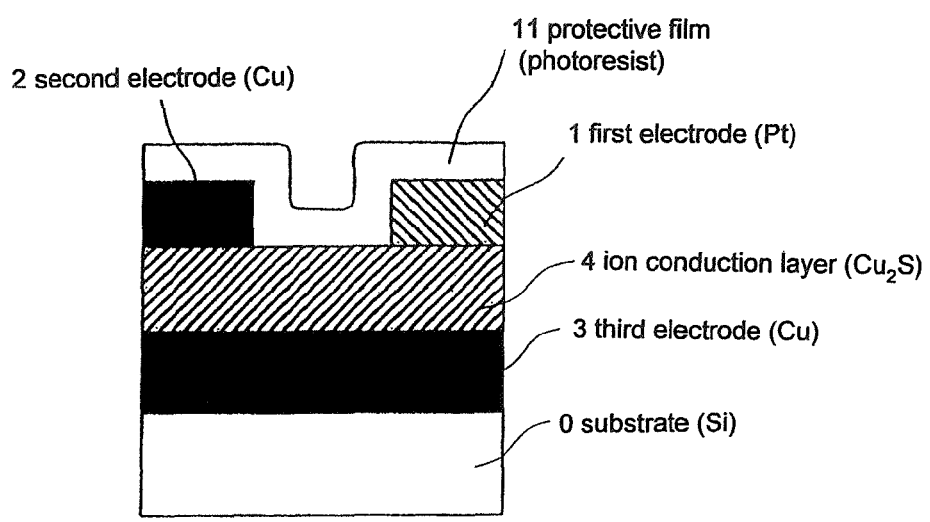
FIG. 8 is a schematic sectional view showing an example of the configuration of the metal atom-mobile switching element of the fourth exemplary embodiment.

FIG. 8 is a schematic view for explaining the configuration of the metal atom-mobile switching element of the present embodiment.

Third electrode 3 (Cu) and ion conduction layer 4 ($Cu_2S$) are stacked on substrate 0, and first electrode 1 (Pt) and second electrode 2 (Cu) are formed on ion conduction layer 4 ($Cu_2S$) separated by a prescribed distance (on the order of 1 nm to 100 nm). First electrode 1 and second electrode 2 are formed on the same plane. First electrode 1, second electrode 2, and third electrode 3 each contact ion conduction layer 4. The exposed surfaces of first electrode 1, second electrode 2, and ion conduction layer 4 are protected by protective film 11 (photoresist). Protective film 11 serves the role of preventing oxidation of the copper of, for example, second electrode 2.

When negative voltage is applied to first electrode 1 relative to second electrode 2, a precipitate grows on the surface (the protective film 11 side) of ion conduction layer 4 between first electrode 1 and second electrode 2, whereby first electrode 1 and second electrode 2 are electrically connected. This precipitation occurs because, since first electrode 1 and second electrode 2 are formed on the same surface of ion conduction layer 4, metal is more prone to precipitate at the interface with protective film 11 than inside ion conduction layer 4. The site at which the precipitate forms is thus fixed, and the variation in ON resistance among switching elements on the same wafer can therefore be reduced.

When a negative voltage is applied to first electrode 1 relative to third electrode 3 while first electrode 1 and second electrode 2 are in an electrically connected state, the width of metal interconnect can be increased, whereby the resistance against electromigration can be increased.

In addition, if voltage is applied to first electrode 1 relative to third electrode 3 to perform a switching operation from the state in which first electrode 1 and second electrode 2 are electrically connected, the malfunction of the switching element that arises from the formation of a metal interconnect between first electrode and the third electrode can be prevented.

Explanation next regards the fabrication method. A silicon substrate covered by $SiO_2$ having a film thickness of 300 nm is used as substrate 0. Using a lithographic technique and lift-off technique of the related art, Cu having a film thickness of 100 nm is formed on the $SiO_2$ for use as third electrode 3. Using the same techniques, $Cu_2S$ is next stacked to a film thickness of 40 nm to serve as ion conduction layer 4. The $Cu_2S$ is formed by a laser ablation method. Next, using conventional techniques, Pt is formed to a film thickness of 40 nm to serve as first electrode 1, and Cu is formed to a film thickness of 40 nm to serve as second electrode 2. Finally, a photoresist is applied as protective film 11 and cured by means of a heat process at 150° C.

A construction is also possible in which protective film 11 is eliminated and ion conduction layer 4 is exposed to the air. Alternatively, protective film 11 is not limited to photoresist and may be composed of a material that is not fine or hard such as an acrylic resin or insulating material. When protective film 11 is made up from a material that is not minute or hard, the stress upon the precipitate is less when the precipitate forms at the interface of ion conduction layer 4 and protective film 11 than when the precipitate forms inside ion conduction layer 4, and the metal interconnect therefore preferentially forms at the interface of ion conduction layer 4 and protective film 11. In other words, the present embodiment obtains the same effects as a case in which an introduction path is formed at the interface of ion conduction layer 4 and protective film 11.

Fifth Embodiment

In the metal atom-mobile switching element of the present embodiment, rather than forming an introduction path in advance, a site for the formation of a precipitate that makes up the metal interconnect that electrically connects the first electrode and the second electrode is fixed by means of the construction of the switching element, as in the metal atom-mobile switching element of the fourth embodiment. The route of the metal interconnect is thus fixed and the variation in the ON resistance among switching elements on the same wafer can therefore be reduced.

Figure 9:
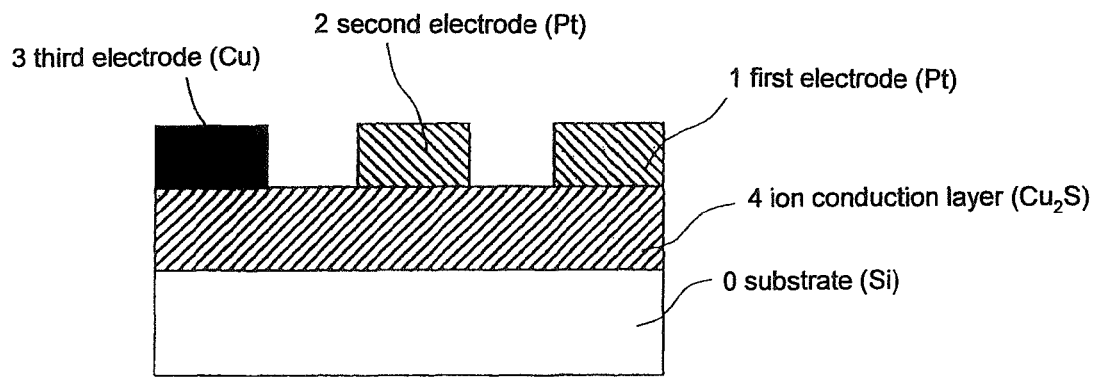
FIG. 9 is a schematic sectional view showing an example of the configuration of the metal atom-mobile switching element of the fifth exemplary embodiment.

FIG. 9 is a schematic sectional view showing an example of the configuration of the metal atom-mobile switching element of the present embodiment.

Ion conduction layer 4 ($Cu_2S$) is formed on substrate 0. First electrode 1 (Pt), second electrode 2 (Pt) separated by a prescribed distance from first electrode 1, and further, third electrode 3 (Cu) separated by a prescribed distance from first electrode 1 are then formed on ion conduction layer 4. Third electrode 3 is preferably formed on the extension of the straight line that joins first electrode 1 and second electrode 2.

When a negative voltage is applied to first electrode 1 relative to third electrode 3, a precipitate begins to grow in the vicinity of the surface of ion conduction layer 4 between first electrode 1 and third electrode 3, and in the process of this growth, this precipitate electrically connects first electrode 1 and second electrode 2. In other words, the present embodiment obtains the same effects as a case in which an introduction path is formed between first electrode 1 and second electrode 2.

Because the location in which the precipitate grows is thus fixed in the vicinity of the surface of ion conduction layer 4, the variation in ON resistance among switching elements on the same wafer can be reduced.

In addition, halting the application of voltage at the stage in which the metal interconnect that is composed of this precipitate electrically connects first electrode 1 and second electrode 2 can prevent electrical connection between first electrode 1 and third electrode 3 and therefore prevent malfunctions of the switching element that arise from this connection.

Explanation next regards the fabrication method. A silicon substrate covered by $SiO_2$ having a film thickness of 300 nm is used as substrate 0. $Cu_2S$, which serves as ion conduction layer 4, is next formed with a film thickness of 40 nm on the $SiO_2$ using conventional lithographic and lift-off techniques. The $Cu_2S$ is formed by a laser ablation method. Using the same techniques, Pt that will serve as first electrode 1 is formed with a film thickness of 40 nm, Pt that will serve as second electrode 2 is formed with a film thickness of 40 nm, and Cu that will serve as third electrode 3 is formed with a film thickness of 40 nm.

Sixth Embodiment

In the metal atom-mobile switching element of the present embodiment as well, rather than form an introduction path in advance, a site in which the precipitate that makes up the metal interconnect that electrically connects the first electrode and the second electrode is fixed by means of the construction of the switching element, as in the metal atom-mobile switching element of the fourth embodiment. The route of the metal interconnect is thus fixed and the variation in ON resistance among switching elements on the same wafer can therefore be reduced.

Figure 10A:
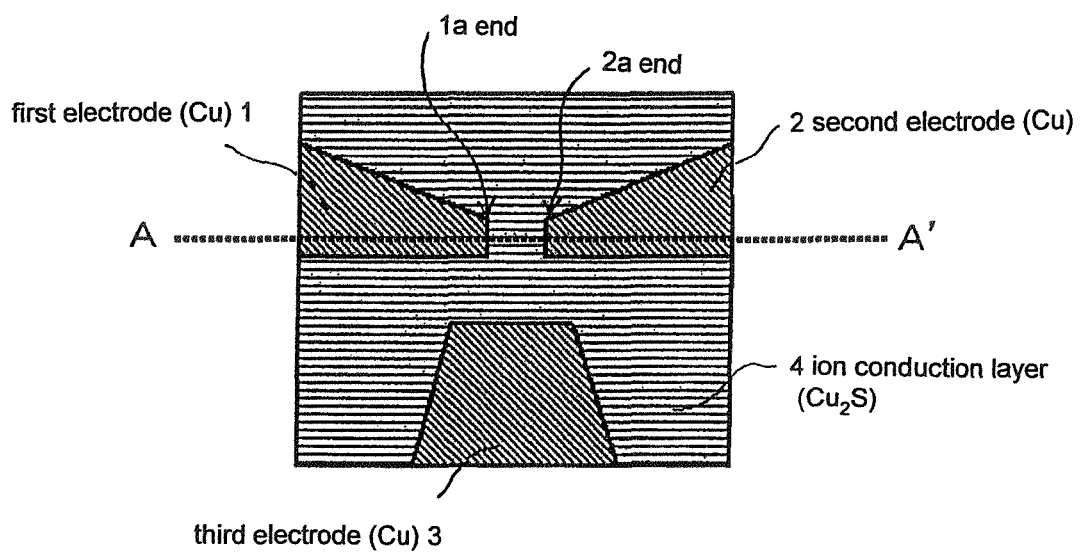
FIG. 10A is a schematic plan view showing an example of the configuration of the metal atom-mobile switching element of the sixth exemplary embodiment.
Figure 10B:
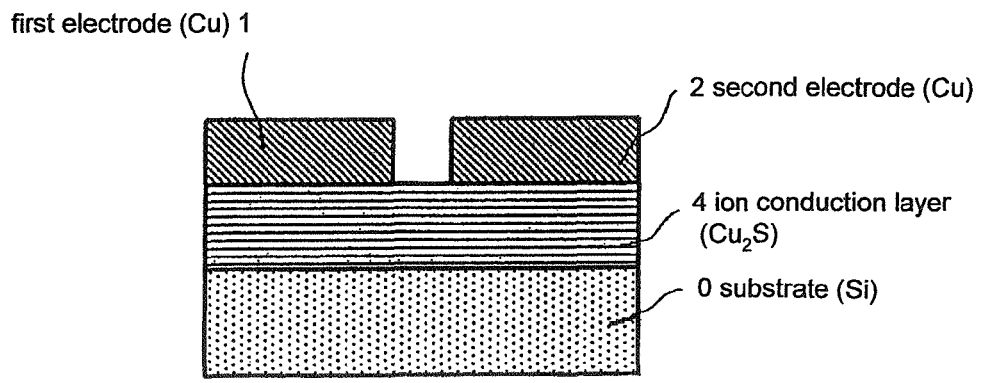
FIG. 10B is a schematic sectional view of the metal atom-mobile switching element shown in FIG. 10A.

FIG. 10A is a schematic plan view showing an example of the configuration of the metal atom-mobile switching element of the present embodiment. FIG. 10B is a schematic sectional view of a position cut along line AA' in the schematic plan view shown in FIG. 10A.

As shown in FIG. 10B, ion conduction layer 4 ($Cu_2S$) is laminated on substrate 0. First electrode 1 (Cu) and second electrode 2 (Cu) are next formed on ion conduction layer 4 ($Cu_2S$) separated by a prescribed distance (on the order of 1 nm to 100 nm). In addition, as shown in FIG. 10A, third electrode 3 (Cu) is formed on the same layer as first electrode 1 and second electrode 2 and separated from these other electrodes by a prescribed distance (on the order of 1 nm to 100 nm). First electrode 1, second electrode 2, and third electrode 3 each contact ion conduction layer 4.

In addition, as shown in FIG. 10A, the shapes of the planar patterns of first electrode 1, and second electrode 2 narrow with increasing proximity to each other, whereby the length of the confronting sides reaches a minimum at ends 1a and 2a that are at the minimum distance between first electrode 1 and second electrode 2. As a result, the route of the precipitate metal forms close to the surface of ion conduction layer 4 between end 1a of first electrode 1 and end 2a of second electrode 2 and is more fixed than the case of the fourth embodiment. The distance between end 1a of first electrode 1 and end 2a of second electrode 2 is assumed to be a first prescribed distance.

Further, although first electrode 1, second electrode 2, and third electrode 3 were formed on the same plane in the fifth embodiment as well, second electrode 2 was positioned between first electrode 1 and third electrode 3. In the present embodiment, as shown in FIG. 10A, first electrode 1 and second electrode 2 are placed in confrontation, and third electrode 3 is positioned such that the shortest distances from each of first electrode 1 and second electrode 2 are equal. In this case, third electrode 3 is closer to the metal that precipitates between first electrode 1 and second electrode 2, whereby the electrical characteristics between the two electrodes are easier to control. If the shortest distances from each of first electrode 1 and second electrode 2 to third electrode 3 are assumed to be a second prescribed distance, the second prescribed distance is greater than the first prescribed distance.

Figure 11A:
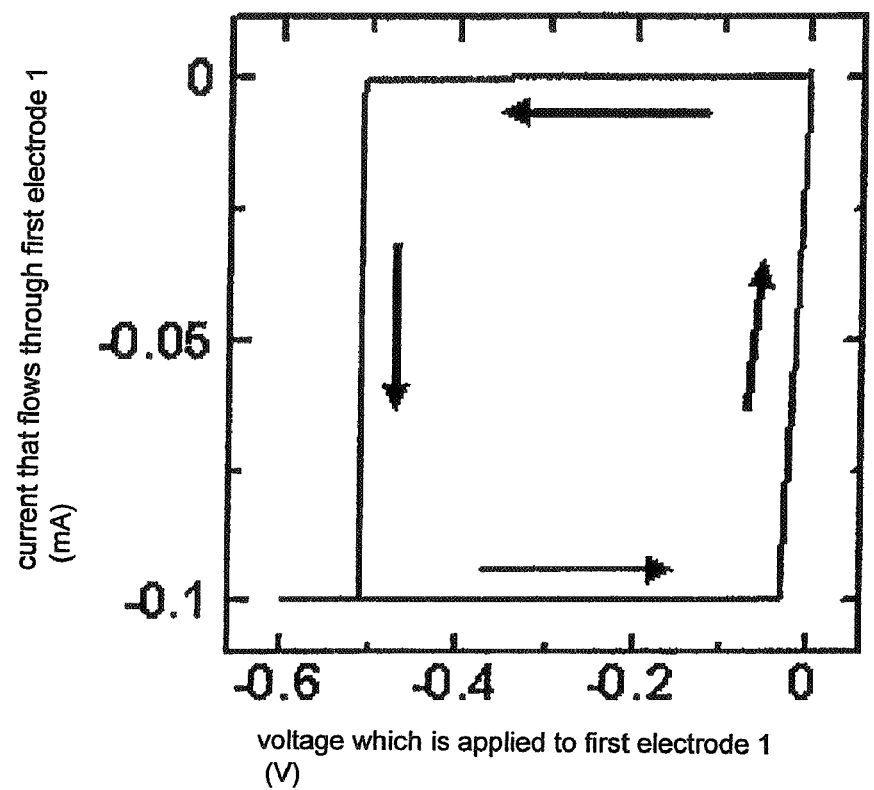
FIG. 11A is a graph showing the precipitation of metal between the first electrode and the second electrode due to the application of negative voltage to the first electrode in the metal atom-mobile switching element of the sixth exemplary embodiment.
Figure 11B:
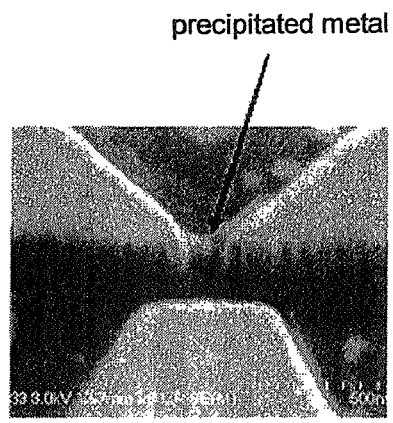
FIG. 11B is an electron microscope photograph showing the formation of metal on the surface of the ion conduction layer in the metal atom-mobile switching element of the sixth exemplary embodiment.

FIG. 11A is a graph showing the current that flows through first electrode 1 with respect to changes in voltage when a negative voltage is applied to the first electrode. FIG. 11B is an electron microscope photograph in which the precipitate is observed following the application of voltage.

When a negative voltage is applied to first electrode 1 relative to second electrode 2, the current increases greatly towards the negative in the vicinity of −0.5 V, as shown in the graph of FIG. 11A. This change indicates that a precipitate grows on the surface of ion conduction layer 4 between first electrode 1 and second electrode 2 when the voltage approaches 0 V from the direction of −0.6 V, and that the two electrodes are electrically connected in the vicinity of −0.5 V. As can be seen from the photograph shown in FIG. 11B, first electrode 1 and second electrode 2 are connected by the precipitated metal. The location in which the precipitate grows is thus fixed, and the variation in ON resistance among switching elements on the same wafer can therefore be reduced.

Figure 12A:
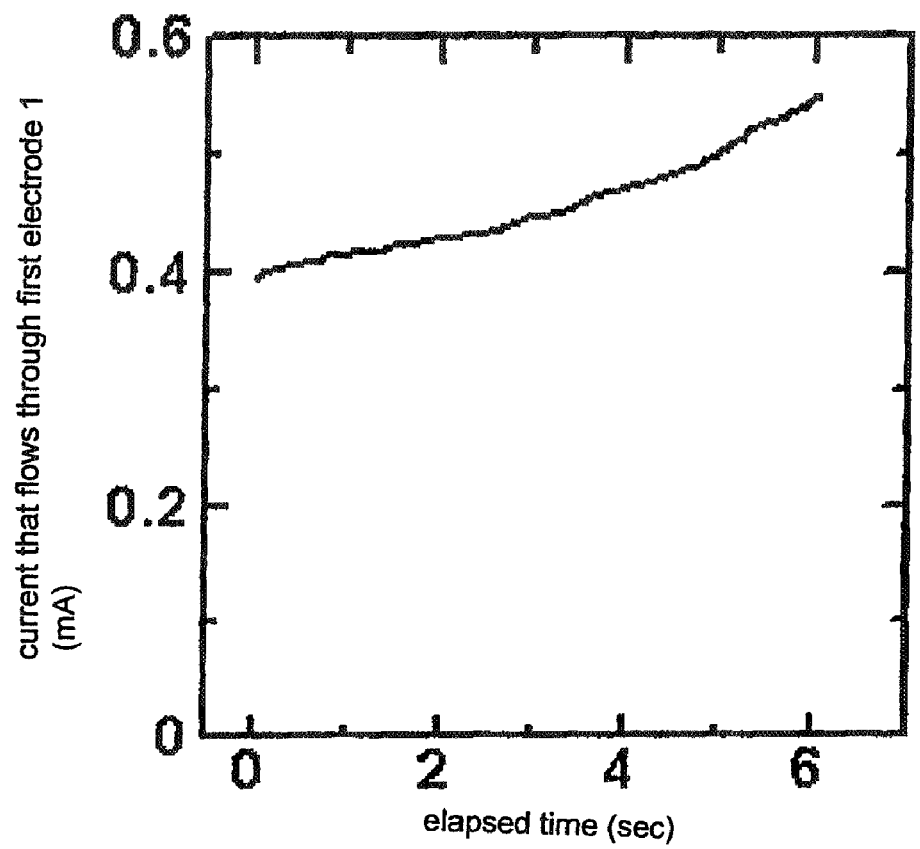
FIG. 12A is a graph showing the further thickening of the metal that precipitates between the first electrode and second electrode due to the application of a positive voltage to the third electrode in the metal atom-mobile switching element of the sixth exemplary embodiment.
Figure 12B:
FIG. 12B is an electron microscope photograph showing the further thickening of the metal that precipitates due to the application of positive voltage to the third electrode in the metal atom-mobile switching element of the sixth exemplary embodiment.

FIG. 12A is a graph showing the change over time of the current that flows through first electrode 1 when voltage is applied to third electrode 3. FIG. 12B is an electron microscope photograph in which the precipitate is observed after application of voltage. A fixed voltage of 0.1 V is applied to first electrode 1, and a fixed voltage of 1 V is applied to third electrode 3. As can be seen from the graph shown in FIG. 12A, the current that flows through first electrode 1 increases with time. As can be seen from the photograph shown in FIG. 12B, the interconnect realized by the precipitated metal is thicker than the state shown in FIG. 11B. This thickening of the metal interconnect can increase the resistance against electromigration.

In addition, the application of voltage to first electrode 1 relative to third electrode 3 to bring about a switching operation from the state in which first electrode 1 and second electrode 2 are electrically connected can prevent malfunctions of the switching element that originate from the formation of a metal interconnect between first electrode 1 and third electrode 3.

The following simplified explanation regards the fabrication method of the metal atom-mobile switching element of the present embodiment. A silicon substrate covered by $SiO_2$ with a film thickness of 300 nm is used as substrate 0. Using conventional lithographic and lift-off techniques, $Cu_2S$ is laminated on the $SiO_2$ to a film thickness of 40 nm for use as ion conduction layer 4. The $Cu_2S$ is formed by means of a laser ablation method. Cu is next formed using conventional methods to a film thickness of 40 nm for use as the first, second, and third electrodes. Since the stress applied to the precipitate is less for a precipitate that grows on the surface of ion conduction layer 4 than a precipitate that grows inside ion conduction layer 4, metal interconnect is preferentially formed on the interface of ion conduction layer 4 and protective film 11. In other words, the present embodiment obtains the same effects as a case in which an introduction path is formed on the surface of ion conduction layer 4.

Additional Points

In the above-described embodiments, the materials that may be used for forming electrodes that do not supply metal ions to ion conduction layer 4 (the first electrode and some of the second electrodes) are not limited to Ti, Ta, and Pt, but may include a refractory metal such as W, silicides (titanium silicide and cobalt silicide). Further, the metal that may be used for forming electrodes that supply metal ions to ion conduction layer 4 (the third electrode and some of the second electrodes) is not limited to Cu, but may include, for example, Ag and Pb. The ion conductor that forms ion conduction layer 4 is not limited to $Cu_2S$, but may be: a compound of a metal and a chalcogen element (O, S, Se, and Te); an insulating material that contains silicon (silicon oxide, silicon nitride, silicon oxide nitride); or a perovskite-type oxide ($ABO_3$, A:Mg, Ca, Sr, Ba, B:Ti).

The metal atom-mobile switching element of the present invention has the following potential applications. By using the metal atom-mobile switching element of the present invention as an element for programming, the metal atom-mobile switching element can make up a reconfigurable logic integrated circuit (programmable logic).

Figure 13:
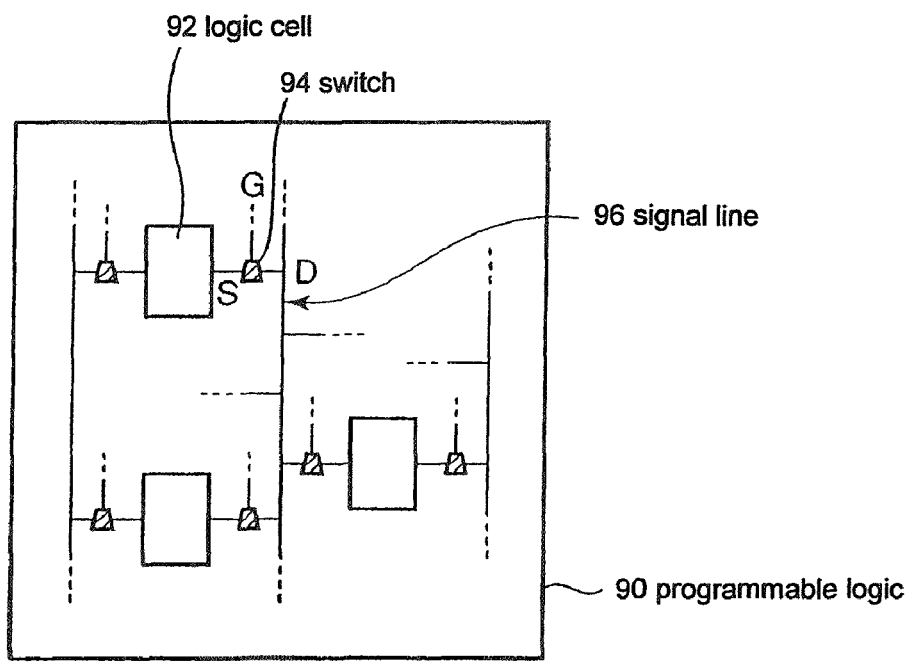
FIG. 13 is a schematic view showing an example of the configuration of programmable logic that uses a three-terminal switch.

Explanation next regards a case in which the above-described three-terminal metal atom-mobile switching element is applied to programmable logic. FIG. 13 is a schematic view showing an example of the configuration of programmable logic.

As shown in FIG. 13, programmable logic 90 is made up from a multiplicity of logic cells 92 arranged in a two-dimensional array, interconnects for interconnecting logic cells, and a multiplicity of switches 94 for switching between connection and nonconnection between the interconnects for connection between the logic cells. Changing the connection state between two terminals (connection/nonconnection) sets the configuration of interconnects between logic cells and the functions of the logic cells, enabling the realization of a logic integrated circuit that matches specifications.

The switches are transistor elements composed of drain electrodes D, source electrodes S and gate electrodes G. When the three-terminal switch of the above-described embodiment is applied to these switches, the first electrode corresponds to drain electrode D, the second electrode corresponds to source electrode S, and the third electrode corresponds to gate electrode G. Source electrode S is then connected to logic cell 92 and drain electrode D is connected to signal line 96 in programmable logic 90, as shown in FIG. 13.

A three-terminal switch that is set to the ON state maintains a state in which source electrode S and drain electrode D are electrically connected. When a logic signal arrives at drain electrode D by way of signal line 96, the logic signal is received as input in logic cell 92 by way of source electrode S. Conversely, a three-terminal switch that is set to the OFF state maintains a state in which the electrical connection between source electrode S and drain electrode D is cut. When a logic signal arrives at drain electrode D by way of signal line 96 in this case, the logic signal cannot be applied as input to logic cell 92 that is connected to source electrode S. The user is thus able to set the connection state between logic cells in programmable logic 90.

Using the three-terminal switch of the present invention as the switch of programmable logic both reduces the leak current of the OFF state of switches and decreases the current consumption of the overall programmable logic compared to the related art.

Figure 14:
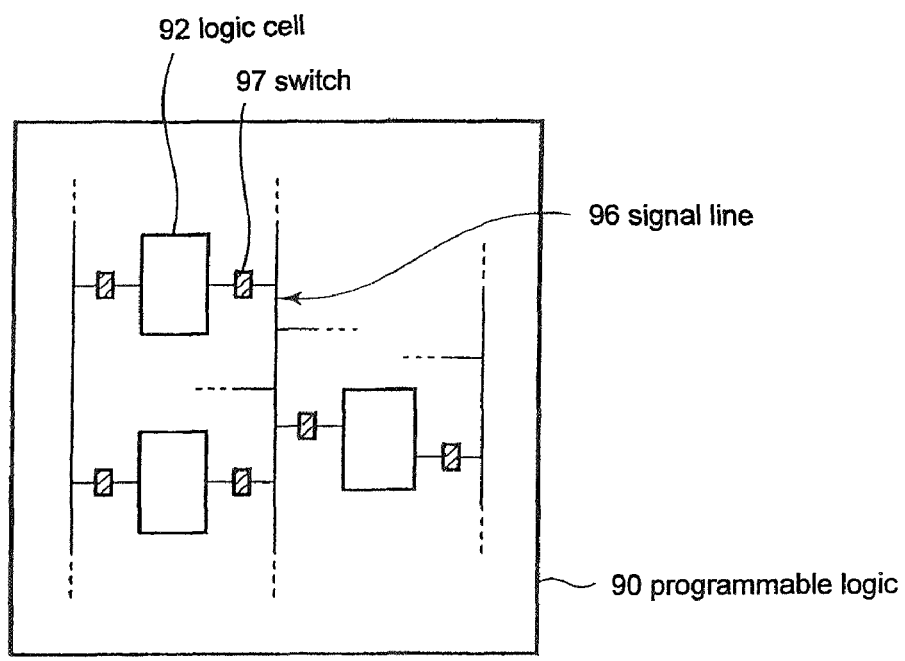
FIG. 14 is a schematic view showing an example of the configuration of programmable logic that uses a two-terminal switch.

FIG. 14 shows a case in which the two-terminal switch of the first embodiment is applied to programmable logic. Components that are equivalent to those of the programmable logic shown in FIG. 13 are given the same reference numbers. The two-terminal switch of the first embodiment is applied to switch 97 shown in FIG. 14. As explained in the first embodiment, placing switch 97 in the ON state or OFF state enables setting of connection/nonconnection with logic cell 92. Applying the two-terminal switch of the first embodiment to the switch of programmable logic obtains the same effects as the programmable logic shown in FIG. 13.

In this case, the switching element of the present invention was used for switching between connection and nonconnection to a logic cell, but the switching element can also be applied to a switch for switching interconnects or for switching the functions of a logic cell.

A memory element can be realized by providing the metal atom-mobile switching element of the present invention and a transistor that reads the electrical characteristics of the metal atom-mobile switching element of the present invention.

Figure 15:
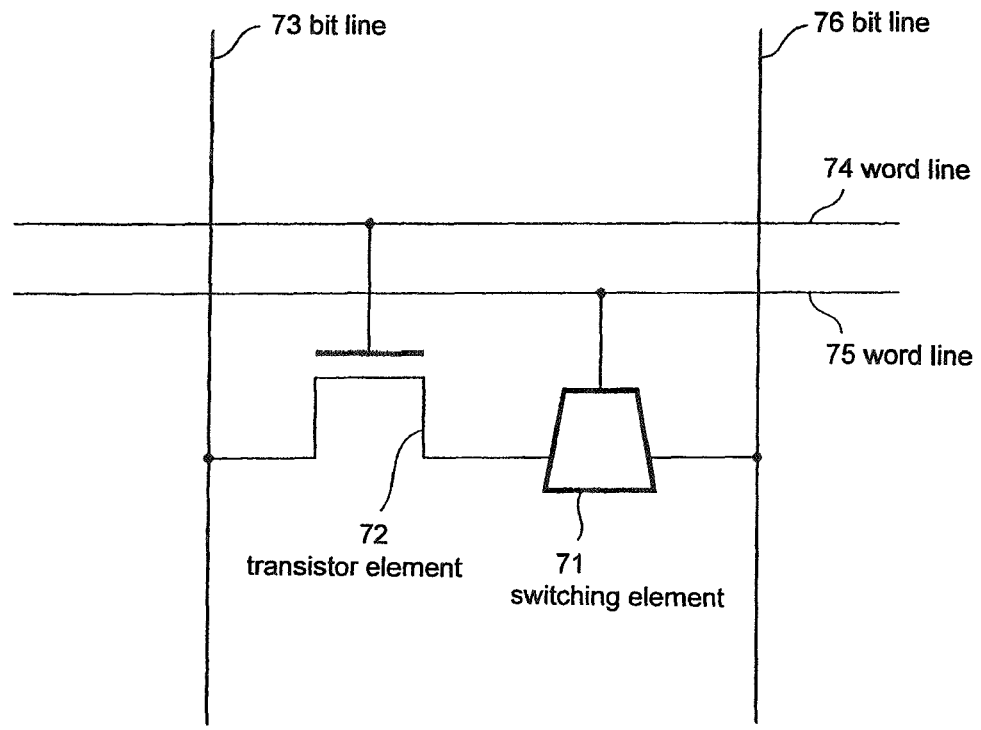
FIG. 15 is a schematic circuit diagram showing an example of the configuration of a memory element that uses a three-terminal switch.

Explanation next regards a case in which the above-described three-terminal metal atom-mobile switch is applied to a memory element. FIG. 15 is a schematic view showing an example of the configuration of a memory element.

As shown in FIG. 15, the memory element includes switching element 71 for holding information and transistor element 72 for reading the information of switching element 71. The three-terminal switch of the above-described embodiment is applied to this switching element 71. Switching element 71 is similar to the configuration of a transistor composed of a drain electrode, source electrode, and gate electrode, these electrodes each corresponding to the first electrode, second electrode, and third electrode, respectively, of the three-terminal switch.

Transistor element 72 has its source electrode connected to bit line 73 and its gate electrode connected to word line 74. Switching element 71 has its source electrode connected to bit line 76 and its gate electrode connected to word line 75. The drain electrode of switching element 71 is connected to the drain electrode of transistor element 72.

Explanation next regards the method of writing information to the memory element. Of the "1" and "0" information that is to be saved, "1" is assumed to be the ON state of the switching element and "0" is assumed to be the OFF state. In addition, the switching voltage of the switching element is assumed to be Vt, and the operating voltage of transistor element 72 is assumed to be VR.

When the information "1" is to be written to the memory element, voltage Vt is applied to word line 75 that is connected to the gate electrode of switching element 71 and the voltage of bit line 76 connected to the source electrode is set to 0 V. Voltage (Vt/2) is then applied to bit line 73. Switching element 71 enters the ON state, and the information "1" is written.

When the information "0" is to be written to the memory element, the voltage of word line 75 connected to the gate electrode of switching element 71 is set to 0V and voltage Vt is applied to bit line 76 connected to the source electrode. Voltage (Vt/2) is then applied to bit line 73. Switching element 71 enters the OFF state, and the information "0" is thus written.

Explanation next regards the method of reading information saved in the memory element.

Voltage VR is applied to word line 74 to set transistor element 72 to ON, and the resistance between bit line 73 and bit line 76 then found. This resistance is the combined resistance of the ON resistance of transistor element 72 and switching element 71. Switching element 71 can be determined to be in the OFF state when this combined resistance is too great to measure, whereby the information saved in the memory element is understood to be "0." On the other hand, switching element 71 can be determined to be in the ON state when the combined resistance is less than a prescribed value, whereby the information saved in the memory element is understood to be "1."

Using the three-terminal switch of the present invention as a switching element for saving information in a memory element reduces the leak current when the switch is in the OFF state. If the memory element of the present embodiment is used in a memory device in which a plurality of memory elements are arranged in an array reduces the current consumption of the overall memory device compared to a conventional memory element.

Figure 16:
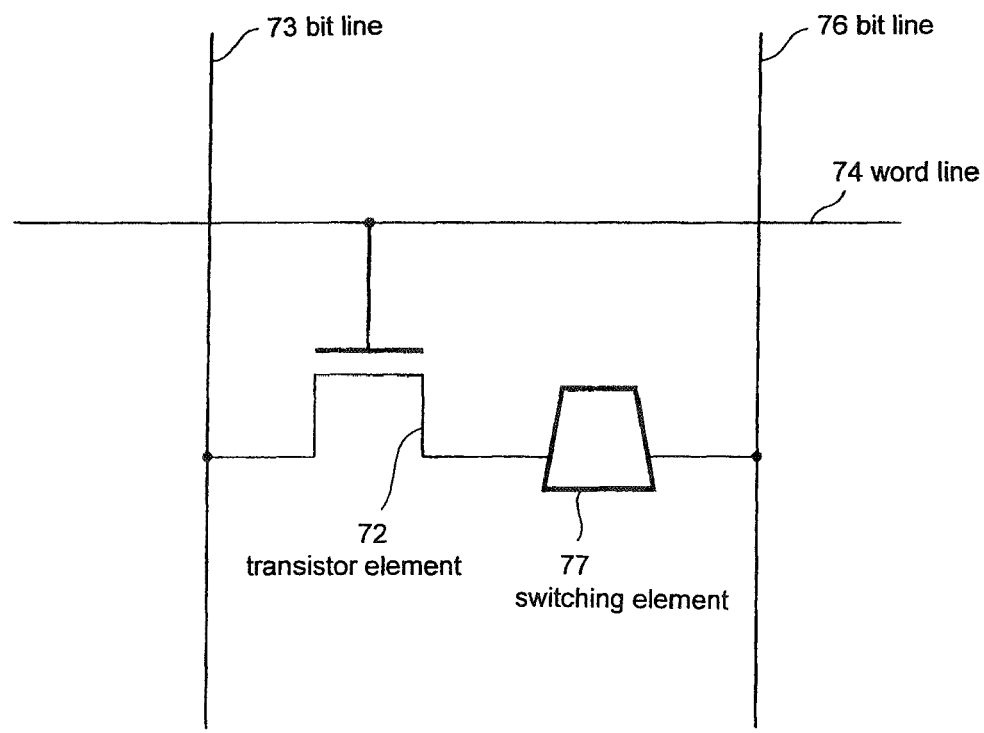
FIG. 16 is a schematic circuit diagram showing an example of the configuration of a memory element that uses a two-terminal switch.

FIG. 16 shows a case in which the two-terminal switch of the first embodiment is applied to a memory element. Component that are equivalent to the memory element shown in FIG. 15 are given the same reference numbers. The two-terminal switch of the first embodiment is applied to switching element 77 shown in FIG. 16. As described in the first embodiment, information can be saved in switching element 77 by setting switching element 77 in the ON state or OFF state. Using the two-terminal switch of the first embodiment in a memory element obtains the same effects as the memory element shown in FIG. 15.

The present invention is not limited to the above-described working examples. The present invention is open to various modifications within the scope of the invention and these modifications are of course included within the scope of the present invention.

The invention claimed is:

1. A switching element comprising:
an ion conduction part that contains an ion conductor in which metal ions can move;
a first electrode that contacts said ion conduction part;
a second electrode that contacts said ion conduction part, that is formed such that said ion conduction part is interposed between said second electrode and said first electrode, and that supplies said metal ions to said ion conductor or that accepts said metal ions from said ion conductor to cause precipitation of metal that corresponds to said metal ions; and
an introduction path of a prescribed width and composed of said metal for electrically connecting said first electrode and said second electrode, said introduction path being provided on said ion conduction part, and being formed prior to an application of voltage to said first electrode relative to said second electrode;
wherein the electrical characteristics of said switching element are switched by an electrochemical reaction between said introduction path and said second electrode that results from an application of voltage to said first electrode relative to said second electrode, wherein the introduction path is surrounded by the ion conduction part.

2. A switching element comprising:
an ion conduction part that contains an ion conductor in which metal ions can move;
a first electrode that contacts said ion conduction part;
a second electrode that contacts said ion conduction part and that is formed such that said ion conduction part is interposed between said second electrode and said first electrode;
a third electrode that is formed to contact said ion conduction part, that supplies said metal ions to said ion conductor, or that receives said metal ions from said ion conductor to cause precipitation of metal that corresponds to said metal ions; and
an introduction path of a prescribed width and composed of said metal for electrically connecting said first electrode and said second electrode, said introduction path being provided on said ion conduction part, and being formed prior to an application of voltage to said first electrode relative to said third electrode;
wherein the electrical characteristics of said switching element are switched by an electrochemical reaction between said introduction path and said third electrode that results from an application of voltage to said first electrode relative to said third electrode,
wherein the introduction path is surrounded by the ion conduction part.

3. The switching element according to claim 1, wherein said metal is one of Cu, Ag, and Pb.

4. The switching element according to claim 2, wherein said metal is one of Cu, Ag, and Pb.

5. The switching element according to claim 1, wherein said ion conductor is one of: a compound of a chalcogen element and a metal; an insulating material that contains silicon; and a perovskite-type oxide.

6. The switching element according to claim 2, wherein said ion conductor is one of: a compound of a chalcogen element and a metal; an insulating material that contains silicon; and a perovskite-type oxide.

7. The switching element according to claim 1, wherein said introduction path is connected to said first electrode and to said second electrode.

8. The switching element according to claim 2, wherein said introduction path is connected to said first electrode and to said second electrode.

* * * * *

UNITED STATES PATENT AND TRADEMARK OFFICE
CERTIFICATE OF CORRECTION

PATENT NO.      : 7,960,712 B2
APPLICATION NO. : 11/722982
DATED           : June 14, 2011
INVENTOR(S)     : Toshitsugu Sakamoto and Hisao Kawaura It is certified that error appears in the above-identified patent and that said Letters Patent is hereby corrected as shown below:

In the Claims

Column 21-22, Line 31-50 (Col. 21) 1-4 (Col. 22)

In Claim 1, delete "A switching element comprising: an ion conduction part that contains an ion conductor in which metal ions can move;

a first electrode that contacts said ion conduction part;

a second electrode that contacts said ion conduction part, that is formed such that said ion conduction part is interposed between said second electrode and said first electrode, and that supplies said metal ions to said ion conductor or that accepts said metal ions from said ion conductor to cause precipitation of metal that corresponds to said metal ions; and an introduction path of a prescribed width and composed of said metal for electrically connecting said first electrode and said second electrode, said introduction path being provided on said ion conduction part, and being formed prior to an application of voltage to said first electrode relative to said second electrode;

wherein the electrical characteristics of said switching element are switched by an electrochemical reaction between said introduction path and said second electrode that results from an application of voltage to said first electrode relative to said second electrode, wherein the introduction path is surrounded by the ion conduction part." and insert - - A switching element comprising:

an ion conduction part that contains an ion conductor in which metal ions can move;

a first electrode that contacts said ion conduction part;

a second electrode that contacts said ion conduction part, that is formed such that said ion Signed and Sealed this
Twenty-seventh Day of August, 2013

Teresa Stanek Rea
*Acting Director of the United States Patent and Trademark Office* conduction part is interposed between said second electrode and said first electrode, and that supplies said metal ions to said ion conductor or that accepts said metal ions from said ion conductor to cause precipitation of metal that corresponds to said metal ions; and an introduction path of a prescribed width and composed of said metal for electrically connecting said first electrode and said second electrode, said introduction path being provided on said ion conduction part, and being formed prior to an application of voltage to said first electrode relative to said second electrode;

wherein the electrical characteristics of said switching element are switched by an electrochemical reaction between said introduction path and said second electrode that results from an application of voltage to said first electrode relative to said second electrode, wherein the introduction path is surrounded by the ion conduction part. - -, therefor.